(12) United States Patent
Forbes

(10) Patent No.: US 7,605,650 B2
(45) Date of Patent: Oct. 20, 2009

(54) SWITCHED CAPACITOR AMPLIFIER WITH HIGHER GAIN AND IMPROVED CLOSED-LOOP GAIN ACCURACY

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 12/079,706

(22) Filed: Mar. 29, 2008

(65) Prior Publication Data

US 2008/0186093 A1 Aug. 7, 2008

Related U.S. Application Data

(63) Continuation of application No. 11/207,212, filed on Aug. 19, 2005, now Pat. No. 7,365,597.

(51) Int. Cl.
*H03F 3/52* (2006.01)
(52) U.S. Cl. .................. 330/109; 330/98; 330/104
(58) Field of Classification Search ............. 330/109, 330/98, 104
See application file for complete search history.

(56) References Cited

U.S. PATENT DOCUMENTS

| | | | | |
|---|---|---|---|---|
| 2,986,707 | A | 5/1961 | Blecher | 330/86 |
| 4,354,169 | A | 10/1982 | Nossek | 333/173 |
| 4,403,195 | A | 9/1983 | Wurzburg | 330/9 |
| 4,404,525 | A | 9/1983 | Amir et al. | 330/9 |
| 4,441,082 | A | 4/1984 | Haque | 330/129 |
| 4,521,743 | A | 6/1985 | Heimer | 330/296 |
| 4,567,363 | A | 1/1986 | Goodnough | 250/214 A |
| 4,604,584 | A | 8/1986 | Kelley | 330/9 |
| 4,647,865 | A | 3/1987 | Westwick | 330/51 |
| 4,691,172 | A | 9/1987 | Fukahori et al. | 330/129 |
| 4,697,152 | A | 9/1987 | Westwick | 330/9 |
| 4,728,828 | A | 3/1988 | Goodnough | 307/493 |
| 4,760,346 | A | 7/1988 | Kultgen et al. | 330/69 |
| 4,806,874 | A | 2/1989 | Michel | 330/9 |
| 4,967,747 | A | 11/1990 | Carroll et al. | 128/419 D |
| 5,016,012 | A | 5/1991 | Scott et al. | 341/118 |

(Continued)

OTHER PUBLICATIONS

Lee, Hoi, et al., "Active-Feedback Frequency-Compensation Technique for Low-Power Multistage Amplifiers", IEEE Journal of Solid-State Circuits, vol. 38, No. 3, Mar. 2003, pp. 511-520.

(Continued)

*Primary Examiner*—Patricia Nguyen
(74) *Attorney, Agent, or Firm*—Dorsey & Whitney LLP

(57) ABSTRACT

A switched capacitor CMOS amplifier uses a first stage non-inverting CMOS amplifier driving a second stage inverting CMOS amplifier. The first stage amplifier is provided with positive feedback to substantially increase the gain of the first stage amplifier. In the described examples, the positive feedback is provided either by connecting a capacitor from the output to the input of the first stage amplifier or by connecting a shunt transistor in parallel with an input transistor and driving the transistor from the output of the first stage amplifier. The substantially increased gain resulting from the positive feedback allows the gain of the switched capacitor amplifier to be set by the ratio of the capacitance of an input capacitor to the capacitance of a feedback capacitor. The amplifier also includes switching transistors for periodically discharging the input capacitor and the feedback capacitor.

26 Claims, 5 Drawing Sheets

U.S. PATENT DOCUMENTS

| | | | | |
|---|---|---|---|---|
| 5,142,238 | A | 8/1992 | White | 330/9 |
| 5,341,050 | A | 8/1994 | Mellissinos et al. | 307/490 |
| 5,359,294 | A | 10/1994 | Ganger et al. | 330/258 |
| 5,363,102 | A | 11/1994 | Ferguson, Jr. | 341/172 |
| 5,475,337 | A | 12/1995 | Tatsumi | 327/551 |
| 5,563,597 | A | 10/1996 | McCartney | 341/150 |
| 5,574,457 | A | 11/1996 | Garrity et al. | 341/172 |
| 5,736,895 | A | 4/1998 | Yu et al. | 327/554 |
| 5,745,010 | A * | 4/1998 | Miyamoto et al. | 330/294 |
| 5,796,300 | A | 8/1998 | Morgan | 330/9 |
| 5,825,230 | A | 10/1998 | Chen et al. | 327/337 |
| 5,838,200 | A | 11/1998 | Opris | 330/258 |
| 5,847,601 | A | 12/1998 | Wang | 330/9 |
| 5,847,607 | A | 12/1998 | Lewicki et al. | 330/258 |
| 5,995,036 | A | 11/1999 | Nise et al. | 341/172 |
| 6,011,433 | A | 1/2000 | Nairn | 330/2 |
| 6,037,836 | A | 3/2000 | Yoshizawa | 330/9 |
| 6,049,247 | A | 4/2000 | Krymski | 330/9 |
| 6,097,248 | A | 8/2000 | Segami | 330/9 |
| 6,140,871 | A | 10/2000 | Taft | 330/9 |
| 6,198,645 | B1 | 3/2001 | Kotowski et al. | 363/59 |
| 6,288,669 | B1 | 9/2001 | Gata | 341/172 |
| 6,362,770 | B1 | 3/2002 | Miller et al. | 341/172 |
| 6,380,806 | B1 | 4/2002 | Ang | 330/258 |
| 6,404,262 | B1 | 6/2002 | Nagaraj et al. | 327/336 |
| 6,411,166 | B2 | 6/2002 | Baschirotto et al. | 330/258 |
| 6,417,728 | B1 | 7/2002 | Baschirotto et al. | 330/9 |
| 6,473,021 | B1 | 10/2002 | Somayajula et al. | 341/172 |
| 6,486,821 | B1 | 11/2002 | Aude et al. | 341/172 |
| 6,577,184 | B2 | 6/2003 | Kwan et al. | 330/9 |
| 6,621,334 | B2 | 9/2003 | Ausserlechner et al. | 330/9 |
| 6,661,283 | B1 | 12/2003 | Lee | 330/9 |
| 6,768,374 | B1 | 7/2004 | Lee | 330/9 |
| 6,778,009 | B1 | 8/2004 | Lee | 330/9 |
| 6,778,010 | B1 | 8/2004 | Michalski | 330/9 |
| 6,781,451 | B2 | 8/2004 | Kwan et al. | 330/9 |
| 6,812,784 | B2 | 11/2004 | Michalski | 330/9 |
| 6,838,930 | B2 | 1/2005 | Huynh | 330/9 |
| 6,853,241 | B2 | 2/2005 | Fujimoto | 330/9 |
| 6,897,720 | B2 | 5/2005 | Fujimoto | 330/9 |
| 6,930,454 | B2 | 8/2005 | Lott | 315/308 |
| 6,957,057 | B2 | 10/2005 | Das | 455/333 |
| 6,992,509 | B2 | 1/2006 | Ko et al. | 327/96 |
| 7,068,203 | B2 | 6/2006 | Maloberti et al. | 341/155 |
| 7,075,364 | B2 * | 7/2006 | Gudem et al. | 327/552 |
| 7,088,273 | B1 | 8/2006 | Perdoor et al. | 341/120 |
| 7,209,000 | B2 * | 4/2007 | Huijsing et al. | 330/9 |

OTHER PUBLICATIONS

Leung, Ka Nang, et al., "Nested Miller Compensation in Low-Power CMOS Design", IEEE Transactions on Circuits and Systems-II: Analog and Digital Signal Processing, vol. 48, No. 4, Apr. 2001, pp. 388-394.

Ramos, João, et al., "Positive Feedback Frequency Compensation for Low-Voltage Low-Power Three-Stage Amplifier", IEEE Transactions on Circuits and Systems-I: Regular Papers, vol. 51, No. 10, Oct. 2004, pp. 1967-1974.

Temes, Gabor C., "Finite Amplifier Gain and Bandwidth Effects in Switched-Capacitor Filters", IEEE Journal of Solid-State Circuits, vol. SC-15, No. 3, Jun. 1980, pp. 358-361.

* cited by examiner

SWITCHED CAPACITOR AMPLIFIER WITH HIGHER GAIN AND IMPROVED CLOSED-LOOP GAIN ACCURACY

This application is a continuation of U.S. patent application Ser. No. 11/207,212, filed Aug. 19, 2005, U.S. Pat. No. 7,365,597.

TECHNICAL FIELD

This invention relates to amplifier circuits, and, more particularly, to a switched capacitor amplifier circuit that provides higher open-loop gain and improved closed-loop gain accuracy.

BACKGROUND OF THE INVENTION

Switched capacitor amplifiers are compatible with CMOS technology and consequently are therefore frequently used as analog building blocks in CMOS circuits. In general, the design methodology in CMOS amplifiers assumes the use of infinite gain and infinite bandwidth operational amplifiers. However, CMOS amplifiers have a relatively low gain because of the low gain inherent in CMOS devices. The maximum gain of a CMOS switched amplifier, i.e., open circuit gain, is approximately 25, and may be as low as 10. The low gain of CMOS switched amplifiers introduce finite gain error when the gain of the amplifier is assumed to be the ratio of the capacitance of an input capacitance to the capacitance of a feedback capacitor.

FIG. 1 shows a switched capacitor amplifier 100 having an input capacitor 104 having a capacitance of Cin connected to an inverting input 116 of an operational amplifier 112, which is assumed to have infinite gain. The amplifier 100 also includes a feedback capacitor 108 having a capacitance of Cfb coupled in series with an NMOS switching transistor 110 between an output 124 of the amplifier 112 and the inverting input 116. The feedback capacitor 108 forms a closed loop via the transistor 110 to provide feedback from an output terminal 124 of the operational amplifier 112 to the inverting input terminal 116. A non-inverting input 120 of the operational amplifier is connected to the ground. As a matter of convention, it should be understood that the terms "non-inverting input" terminal and "inverting input" terminal are used with respect to their relationship to a particular output terminal. An amplifier could alternatively be considered to have an "inverting output" terminal and a "non-inverting output" terminal, as one skilled in the art will appreciate. For example, rather than refer to an amplifier as having an inverting input terminal and an output terminal, one could refer to the same amplifier as having an input terminal and an inverting output terminal.

Another switched NMOS transistor 126 is connected between the input capacitor 104 and an input voltage source 128. The gates of the transistors 110, 126 both receive a $Q_1$ switching signal so they are both ON at the same time. When the transistors 110, 126 are turned ON, the input voltage source 128 is applied to the input capacitor 104. As a result, the input capacitor 104 is charged since the input terminal 116 is a virtual ground because of the feedback through the capacitor 108. The capacitor 108 is also charged for that same reason. The capacitor 108 is charged to a voltage Vout that is equal to the product of the voltage −Vin and ratio of the capacitance of the input capacitor 104 to the capacitance of the feedback capacitor 108.

A switched NMOS transistor 136 is connected between the input capacitor 104 and the ground, another NMOS transistor 138 is connected between the feedback capacitor 108 and ground, and another NMOS transistor 140 is connected between the output terminal 124 and the inverting input 116. When the transistors 136, 138, 140 are ON responsive to a high $Q_2$ signal applied to their gates, the capacitors 104, 108 are discharged to the ground, and the output terminal 124 is reset to zero volts.

In operation, the $Q_1$ and $Q_2$ signals are alternately driven to a high logic level. Therefore, the transistors 110, 126 are operated in a complementary manner with the transistors 136, 138, 140 thereby causing the capacitors 104, 108 to be alternately charged and discharged. Periodically discharging the capacitors 104, 108 prevents offsets that would otherwise be present at the output terminal 124 of the amplifier 100.

In the discussion of the amplifier 100 shown in FIG. 1, it was assumed that the open-loop gain of the operational amplifier 112 was infinite. However, a typical CMOS differential amplifier does not have an open-loop gain that even approaches infinity. With an operation amplifier 112 having a more limited open-loop gain, the approximate closed loop gain of the operational amplifier is given by the following equation:

$$Vout/Vin = -Av/[((1+Cfb*(Av+1))/Cin)] \quad (1)$$

where Av is the open-loop gain of the operational amplifier.

If Av is very large, equation (1) can be approximated as follows:

$$Vo/Vin = -Cin/Cfb \quad (2)$$

Thus, as explained above with respect to the amplifier 112 used in the amplifier 100 of FIG. 1, if the open-loop gain Av is very large, the closed-loop gain of the amplifier is approximately equal to the ratio of the capacitance Cin of the input capacitor 104 to the capacitance Cfb of the feedback capacitor 108. However, since CMOS amplifiers invariably do not have high open-loop gain, equation (2) does not provide an accurate result.

Suppose for example, Av=100 and Cin/Cfb=10. If Av is very large, equation (2) can be used, and Vo/Vin=−10. However, if Av is 10, then, equation (1) provides Vo/Vin=−9. The simplified formula, i.e., equation (2), based on the ratio of the capacitances predicts a gain of 10, but the actual gain from a more accurate analysis using equation (1) predicts a gain of 9. The error, which is the difference in gain, is caused by the low open-loop gain of the CMOS amplifier. If the open-loop gain of the CMOS amplifier could be increased, the error could be eliminated, and the closed-loop gain of the amplifier would be simply the ratio of the input capacitance Cin to the feedback capacitance Cfb given by equation (2). Since the capacitance of capacitors can be controlled fairly precisely during manufacture, the gain of a switched capacitance amplifier could then be precisely controlled.

Another technique for dealing with the relatively low open-loop gain of CMOS amplifiers is to factor the open-loop gain of the CMOS amplifier into the closed-loop gain using equation (1) to provide the desired level of gain. However, it is fairly impractical to fabricate a CMOS amplifier with a precisely controlled open-loop gain since the gain can vary with process variations. The open-loop gain of a CMOS amplifier can also change with temperature or supply voltage variations. Without a stable value for the open-loop gain of a CMOS amplifier, it is not possibly to use equation (1) to calculate a precise closed-loop gain for a switched capacitor amplifier.

There are also other approaches that can be used for attempting to provide switched capacitance CMOS amplifiers with stable gain characteristics. However, all of these approaches impose limitations or costs on switched capacitance CMOS amplifiers using these approaches. For example, some approaches result in the use of greatly increased surface area on a die, and other approaches provided somewhat limited performance.

Accordingly, there is a need for a CMOS amplifier circuit having very high open-loop gain so that the closed-loop gain of a switched capacitor amplifier can be precisely controlled and does not vary with process, supply voltage and temperature variations.

SUMMARY OF THE INVENTION

An amplifier circuit includes a first stage amplifier having an input terminal and an output terminal. The first stage amplifier is configured to operate with positive feedback and therefore has a very high gain. The amplifier circuit also includes a second stage amplifier having an input terminal and an output terminal. The input terminal of the second stage amplifier is coupled to the output terminal of the first stage amplifier. The first stage amplifier and the second stage amplifier together forming an inverting amplifier between the output terminal of the second stage amplifier and the input terminal of the first stage amplifier. The second stage amplifier may have a relatively small amount of gain compared to the gain of the first stage amplifier. A first feedback capacitor is connected between the output terminal of the second stage amplifier and the input terminal of the first stage amplifier. The first feedback capacitor provides negative feedback from the output terminal of the second stage amplifier to the input terminal of the first stage amplifier. The positive feedback of the first stage amplifier may be provided by a capacitor connected between a non-inverting output of the first stage amplifier and the input of the first stage amplifier. Positive feedback may also be provided by connecting a transistor in parallel with an input transistor having a gate that is coupled to the input terminal of the first stage amplifier. The gate of the transistor is then coupled to a non-inverting output terminal of the first stage amplifier.

DETAILED DESCRIPTION

Figure 1:
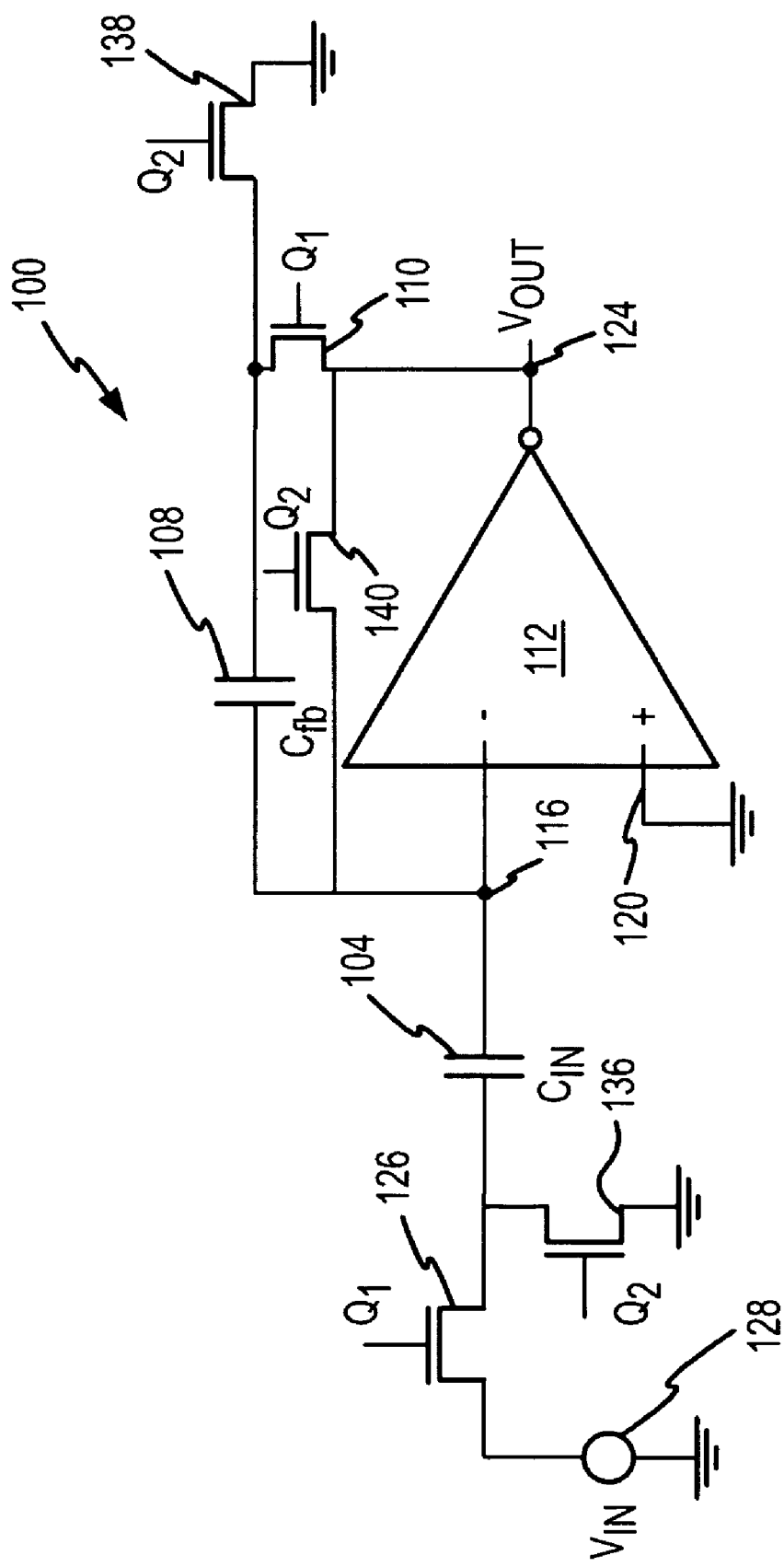
FIG. 1 is a schematic diagram of one example of a conventional switched capacitor amplifier.
Figure 2:
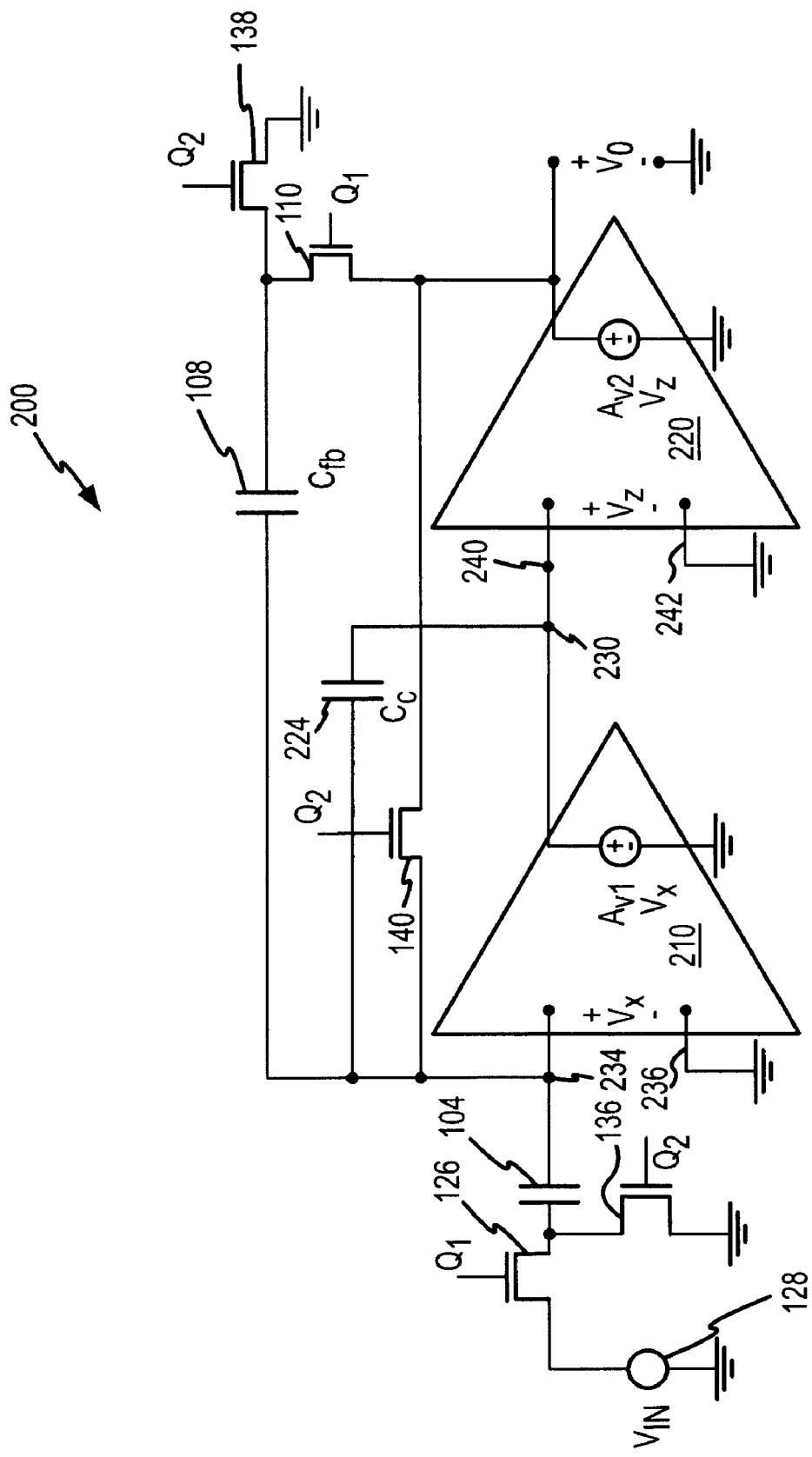
FIG. 2 is a schematic diagram of a CMOS switched capacitor amplifier according to one example of the invention.

A switched capacitance CMOS amplifier 200 according to one example of the invention is shown in FIG. 2. The amplifier 200 uses a first CMOS amplifier 210, a second CMOS amplifier 220, and the same components that were used externally to the amplifiers 210, 220 that were used externally of the amplifier 112 in the amplifier 100 shown in FIG. 1. In addition, the first CMOS amplifier 210 includes a capacitor 224 having a capacitance of Cc connected between its output 230 and a non-inverting input 234. An inverting input of the 236 of the amplifier 210 is connected to ground. In operation, the capacitor 224 provides the amplifier 210 with positive feedback, thereby greatly increasing its gain.

The output 230 of the first CMOS amplifier 210 is connected to an inverting input 240 of the second CMOS amplifier 220. A non-inverting input 242 of the amplifier 220 is connected to ground. The amplifier 220, like typical CMOS amplifiers, has a relatively low gain. However, because of the very high gain of the first amplifier 210, the gain of the two amplifiers 210, 220 together is very large. The amplifiers 210, 220 can be considered to be a single amplifier having a very large open-loop gain as in the amplifier 100 shown in FIG. 1. The amplifier 200 therefore operates in the same manner as explained above for the amplifier 100, and its closed-loop gain is therefore given by equation (2) as simply −Cin/Cfb, where Cin is the capacitance of the input capacitor 104 and Cfb is the capacitance of the feedback capacitor 108. As previously explained, it is possible to fabricate the capacitors 104, 108 with fairly precise capacitances. Furthermore, the capacitances of these capacitors do not change appreciably with process, supply voltage and temperature variations. As a result, the amplifier 200 has precise, very stable gain characteristics.

Figure 3A:
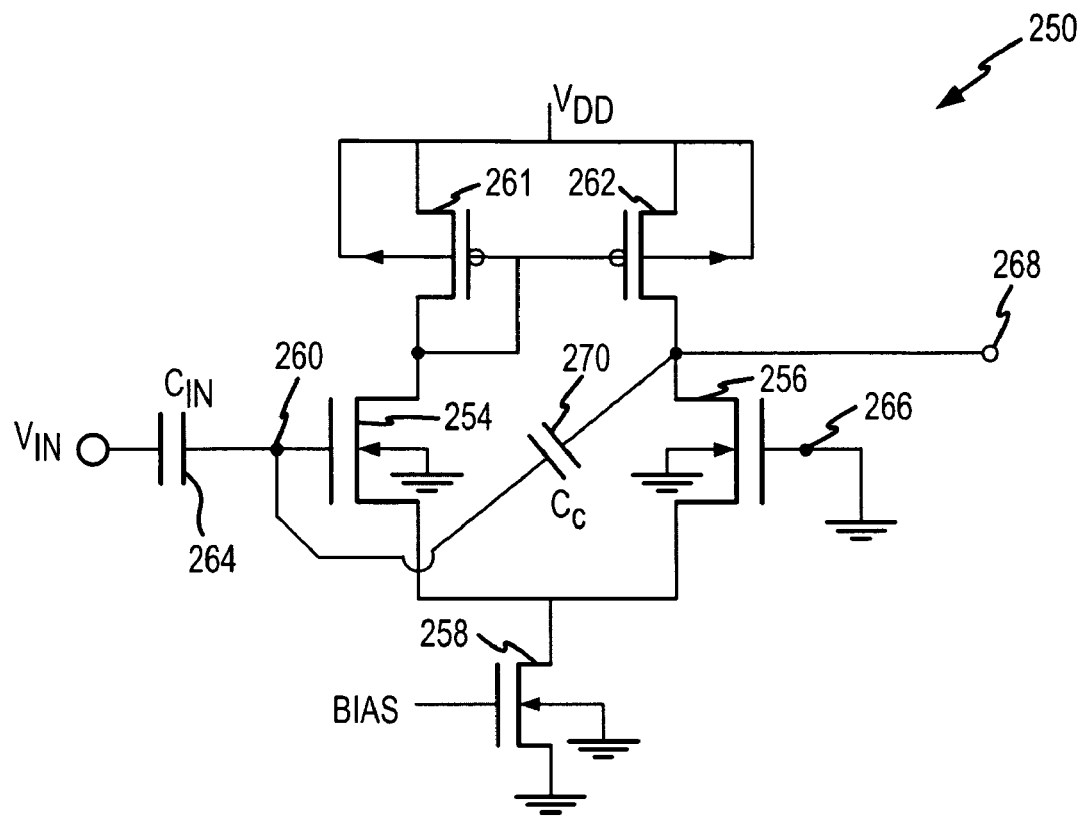
FIG. 3A is a schematic diagram of a CMOS amplifier that can be used in the switched capacitor amplifier of FIG. 2 or in some other example of the invention.

A CMOS amplifier 250 with positive feedback according to one example of the invention is shown in FIG. 3A. The amplifier includes a pair of differential NMOS input transistors 254, 256, a current sink NMOS transistor 258, and a pair of PMOS load transistors 261, 262 coupled to each other to act as a current mirror. The transistors 254-262 are coupled to each other in a conventional manner, and such amplifiers are in common use. The gate of the input transistor 254 serves as a non-inverting input terminal 260 to which an input voltage Vin is coupled through an input capacitor 264 having a capacitance of Cin. (The NMOS switching transistors shown in FIGS. 1 and 2 have been omitted from FIG. 3A in the interest of clarity). The gate of the input transistor 256 serves as an inverting input terminal 266, which is connected to ground. The transistors 254, 260 form a first current path, and the transistors 256, 262 form a second current path. The current mirror formed by the transistors 260, 262 ensures that the currents through the first and second current paths are equal to each other. The drain of the input transistor 256 serves as an output terminal 268 for the amplifier 250. A feedback capacitor 270 having a capacitance of Cc is connected between the output terminal 268 and the non-inverting input terminal 260. The feedback capacitor 270 provides positive feedback to greatly increase the gain of the amplifier 250.

Figure 3B:
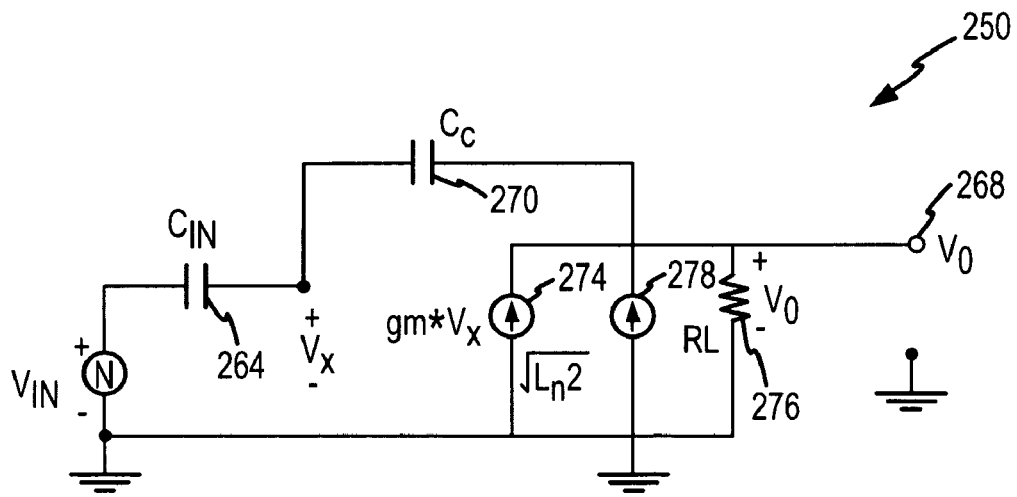
FIG. 3B is a schematic diagram of an equivalent circuit for the CMOS amplifier of FIG. 3A.

An equivalent circuit for the CMOS amplifier 250 of FIG. 3A is shown in FIG. 3B. The voltage between the input terminals 260, 266 is labeled Vx, and the voltage at the output terminal 268 is Vo. The input transistor 256 is modeled by a current source 274 providing a current having a magnitude of gm*Vx, where gm is the transconductance of the amplifier 250. The transistor 262 is modeled by a load resistor 276 having a resistance $R_L$. A second current source 278 provides a relatively small current that can be ignored for the present analysis.

Without the presence of the feedback capacitor 270, the voltage Vx would be equal to the input voltage Vin. The voltage Vo would therefore be the product of the current gm*Vin and the resistance $R_L$ of the load resistor 276, i.e., Vin*gm*$R_L$. The gain of the amplifier 250, Vo/Vin, would therefore be simply gm*$R_L$.

With the feedback capacitor 270, the gain of the amplifier 250 is given by the equation:

$$Vo/Vin = (gm*R_L*Cin)/[Cin - Cc(gm*R_L-1)] \qquad (3)$$

It can be seen from Equation 3 that the gain Vo/Vin can become very large if the denominator Cin−Cc(gm*$R_L$−1) becomes very small by making Cin only slightly larger than Cc(gm*$R_L$−1). However, the amplifier 250 is conditionally stable and will not oscillate as long as the value of Cin−Cc (gm*$R_L$−1) does not become too large. Nevertheless, gains of 100 or more are easily achievable.

Figure 4:
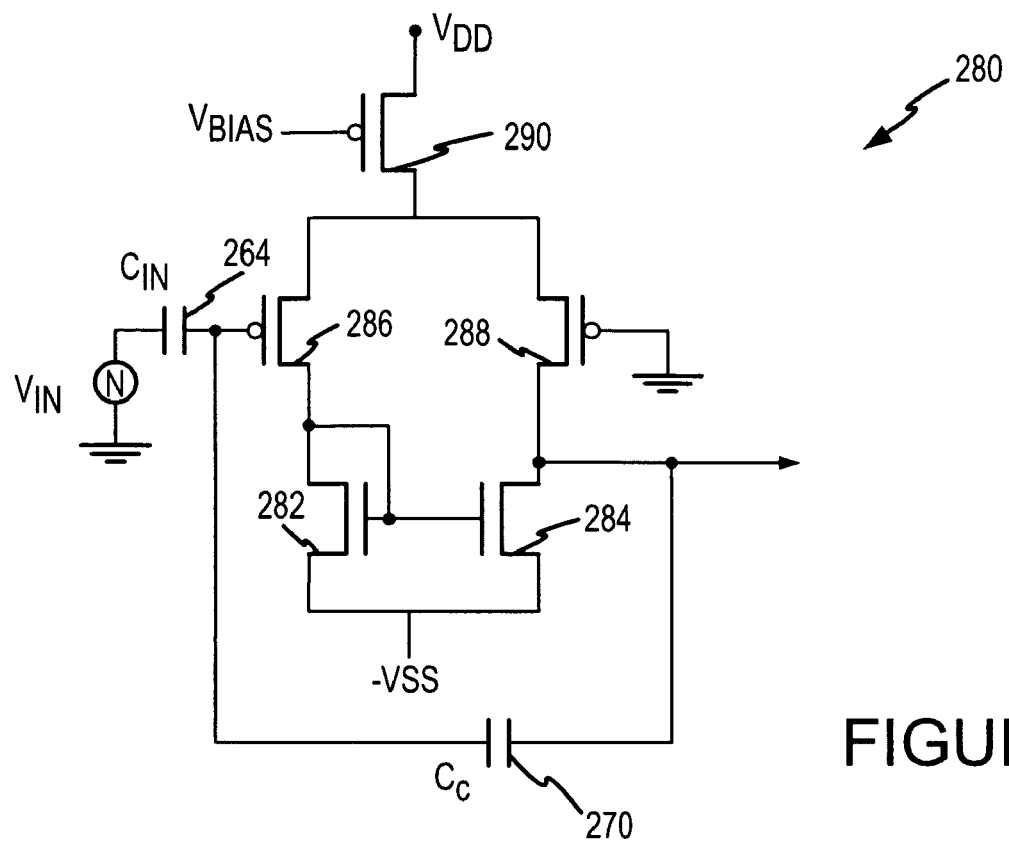
FIG. 4 is a schematic diagram of another example of a CMOS amplifier that can be used in the switched capacitor amplifier of FIG. 2 or in some other example of the invention.

An alternative example of a CMOS amplifier 280 that can be used in the switched capacitor amplifier of FIG. 2 or in some other example of the invention is shown in FIG. 4. The amplifier 280 can be thought of as the compliment to the amplifier 250 shown in FIG. 3A in that it uses NMOS load transistors 282, 284 instead of the PMOS load transistors 261, 262 used in the amplifier 250, and it uses PMOS input transistors 286, 288 and a PMOS current source transistor 290 instead of the NMOS input transistors 254, 256 and NMOS current sink transistor 258, respectively, used in the amplifier 250. However, the amplifier 280 operates in substantially the same manner as the amplifier 250, and it uses the same input capacitor 264 and the same feedback capacitor 270.

Figure 5:
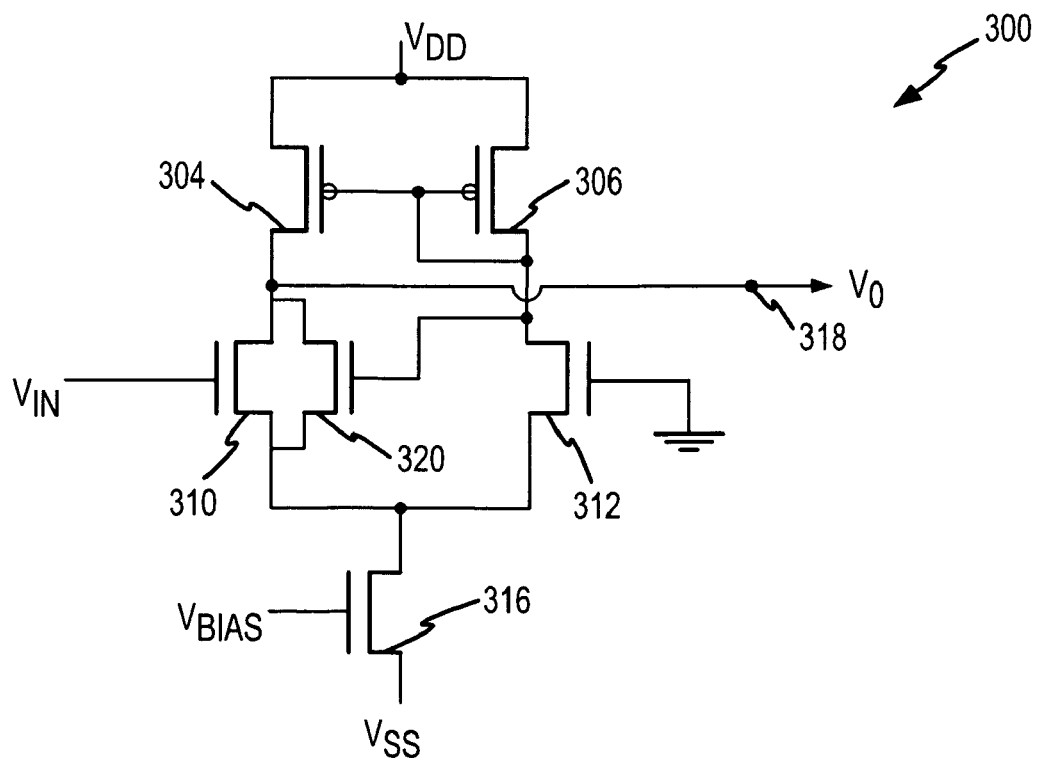
FIG. 5 is a schematic diagram of another example of a CMOS amplifier that can be used in the switched capacitor amplifier of FIG. 2 or in some other example of the invention.

Still another example of a CMOS amplifier 300 that can be used in the switched capacitor amplifier of FIG. 2 or in some other example of the invention is shown in FIG. 5. Like the amplifier 250 shown in FIG. 3A, the amplifier 300 uses a pair of PMOS load transistors 304, 306 connected to each other as current mirrors. The amplifier 300 also uses a pair of NMOS input transistors 310, 312 and an NMOS current sink transistor 316. However, unlike the amplifier 250, in which the output terminal 268 is taken from the drain of the transistor 312, an output terminal 318 is taken from the drain of the transistor 310. As a result, the gate of the transistor 310 constitutes an inverting input rather than a non-inverting input as in the amplifier 250 of FIG. 3A. In the amplifier 300 of FIG. 5, positive feedback is provided by connecting an NMOS transistor 320 in parallel with the inverting input transistor 310. The transistor 320 preferably has a small channel width in comparison to the channel width of the transistor 310. The gate of the transistor 320 is driven by the drain of the input transistor 312.

In operation, an increase in the magnitude Vin of the input voltage decreases the impedance of the input transistor 310, thereby decreasing the voltage at the drain of the transistor 310. Consequently, the magnitude Vo of the output voltage decreases. The decreased impedance of the input transistor 310 also causes more current to flow through the first current path formed by the transistors 304, 310. However, because of the current mirror, the current flowing through the second current path formed by the transistors 306, 312 must decrease. The impedance of the transistor 306 is essentially constant. As a result, the decreased current flowing through the second current path increases the voltage at the drain of the non-inverting input transistor 312, which is coupled to the gate of the transistor 320. The impedance of the transistor 320 then decreases to further decrease the impedance across the input transistor 310, which further decreases the magnitude Vo of the output voltage. Consequently, the transistor 320 provides the amplifier 300 with positive feedback.

Figure 6:
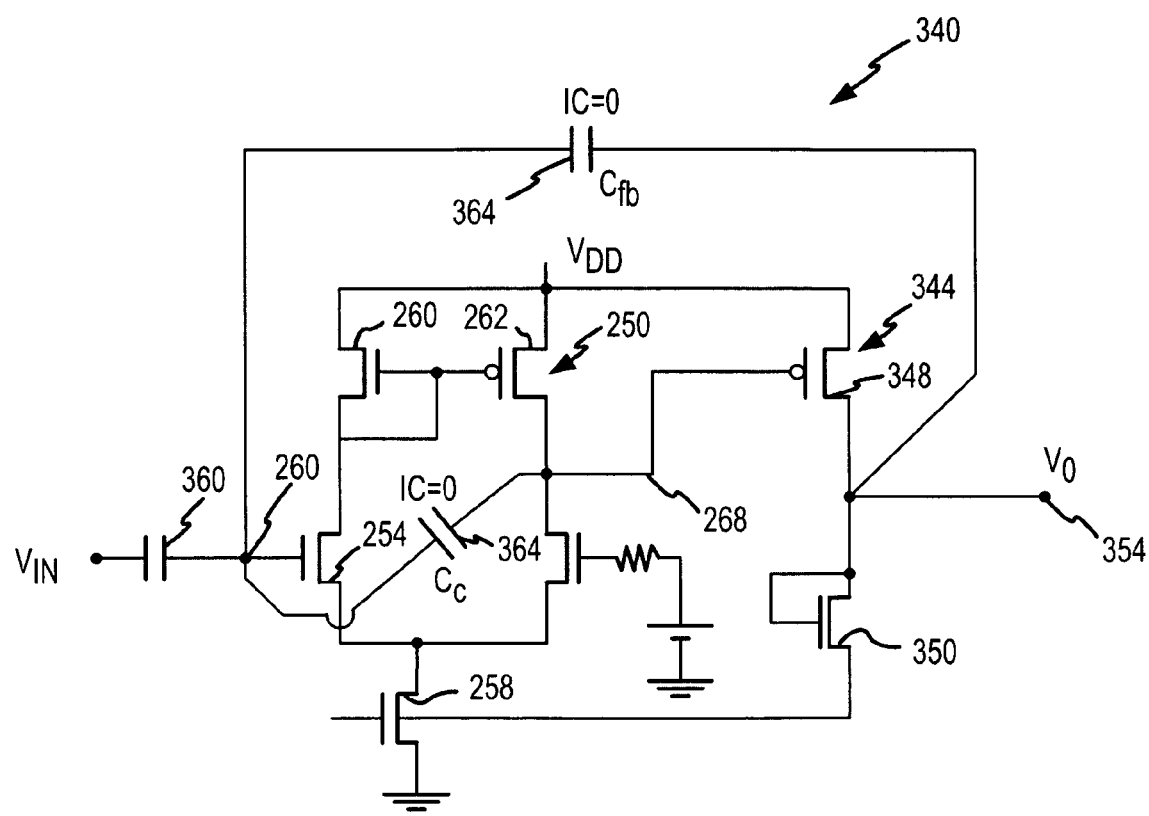
FIG. 6 is a schematic diagram of a CMOS switched capacitor amplifier according to another example of the invention.

A specific example of a switched capacitor CMOS amplifier 340 is shown in FIG. 6. The amplifier 340 uses as its first amplifying stage the positive feedback CMOS amplifier 250 shown in FIG. 3A The amplifier 250 functions in the same manner as previously explained. Therefore, the components have been provided with the same reference numerals, and, in the interest of brevity, an explanation of their function and operation will not be repeated.

The amplifier 340 includes as its second amplifying stage a unity gain inverting amplifier 344 formed by a PMOS input transistor 348 connected in series with a diode-connected NMOS transistor 350. The non-inverting output terminal 268 of the amplifier 250 is connected to the gate of the transistor 348, and an output terminal 354 is taken at the drain of the transistor 348. As in the other examples, an input capacitor 360 having a capacitance of Cin is connected to the gate of the transistor 254, and a feedback capacitor 364 having a capacitance of Cfb is connected between the output terminal 354 and the non-inverting input terminal 260. Insofar as the amplifier 344 is an inverting amplifier, the capacitor 364 provides negative feedback. The gain of the amplifier 250 is given by equation (3) and, since the gain of the amplifier 344 is simply −1, the open-loop gain of the amplifier is given by the equation:

$$Vo/Vin = -(gm*R_L*Cin)/[Cin - Cc(gm*R_L-1)] \qquad (4)$$

As previously explained with reference to FIG. 3A, the gain of the amplifier 250 can be made very large, thereby making the open-loop gain of the amplifier 340 very large. Consequently, the closed-loop gain of the amplifier 340 is essentially equal to Cin/Cc, where Cin is the capacitance of the input capacitor 360 and Cc is the capacitance of the feedback capacitor 364. The closed-loop gain of the amplifier 340 is therefore substantially insensitive to process, supply voltage and temperature variations.

In addition to the first stage amplifier 250, the unity gain inverting amplifier 344, the input capacitor 360, and the feedback capacitor 364, the switched capacitor CMOS amplifier 340 shown in FIG. 6 uses the same components that were used externally of the amplifier 112 in the amplifier 100 shown in FIG. 1. These components operate in the same manner responsive to the $Q_1$ and $Q_2$ signals to periodically charge and discharge the input capacitor 360 and the feedback capacitor 364. However, these components have been omitted from FIG. 6 in the interest of clarity.

Although the present invention has been described with reference to the disclosed embodiments, persons skilled in the art will recognize that changes may be made in form and detail without departing from the spirit and scope of the invention. For example, the amplifier 340 of FIG. 6 uses the unity gain inverting amplifier 344 as the second amplifying stage of the amplifier 340 because the non-inverting positive feedback amplifier 250 is used as the first amplifying stage of the amplifier 340. However, if the inverting positive feedback amplifier 300 shown in FIG. 5 was used as the first amplifying stage of the amplifier 340, a non-inverting amplifier would be used as the second amplifying stage of the amplifier 340. Such modifications are well within the skill of those ordinarily skilled in the art. Accordingly, the invention is not limited except as by the appended claims.

I claim:

1. An amplifier circuit, comprising:
   a first stage amplifier having an input terminal and an output terminal, the first stage amplifier being configured to operate with positive feedback;
   a second stage amplifier having an input terminal and an output terminal, the input terminal of the second stage amplifier being coupled to the output terminal of the first stage amplifier, the first stage amplifier and the second stage amplifier together forming an inverting amplifier between the output terminal of the second stage amplifier and the input terminal of the first stage amplifier;

a first feedback capacitor connected between the output terminal of the second stage amplifier and the input terminal of the first stage amplifier, the first feedback capacitor being operable to provide negative feedback from the output terminal of the second stage amplifier to the input terminal of the first stage amplifier; and a second feedback capacitor connected between the output terminal of the first stage amplifier and a non-inverting input terminal of the first stage amplifier, the second feedback capacitor being operable to provide positive feedback to the first stage amplifier.

2. The amplifier circuit of claim 1 wherein the first stage amplifier comprises:

an input transistor having a gate coupled to the input terminal of the first stage amplifier; and a positive feedback transistor coupled in parallel with the input transistor, the positive feedback transistor having a gate coupled to a node of the first stage amplifier that is non-inverting with respect to the input signal applied to the input terminal of the first stage amplifier.

3. The amplifier circuit of claim 1 wherein the first stage amplifier comprises:

a first and a second CMOS transistors coupled to form a first path for a current to flow from a first potential, the second CMOS transistor having a gate coupled to the input terminal of the first stage amplifier;

a third and a fourth CMOS transistors coupled to form a second path for a current to flow from the first potential, the fourth CMOS transistor having a gate coupled to a first bias voltage, the first and third CMOS transistors being coupled together at their respective gates; and a fifth CMOS transistor coupled to the second and fourth CMOS transistors and operable to receive the currents from the first and second paths and allow the currents to flow to the second potential.

4. The amplifier circuit of claim 3 wherein the fifth CMOS transistor is biased to allow a regulated current to flow through the fifth CMOS transistor.

5. The amplifier circuit of claim 3 wherein the first and the third CMOS transistors comprise PMOS-type transistors.

6. The amplifier circuit of claim 3 wherein the second, fourth and fifth CMOS transistors comprise NMOS-type transistors.

7. The amplifier circuit of claim 3 wherein the input capacitor is connected between the amplifier input terminal and a gate of the second transistor, and wherein a second feedback capacitor is connected between a drain of the fourth transistor and the gate of the second transistor.

8. The amplifier circuit of claim 3 wherein the first stage amplifier comprises a positive feedback transistor coupled in parallel with the second transistor, the positive feedback transistor having a gate coupled to the drain of the fourth transistor.

9. The amplifier circuit of claim 3 wherein the first and third CMOS transistors are configured to as a current mirror so that the magnitude of the current flowing through the first current path is equal to the current flowing through the second current path.

10. The amplifier circuit of claim 3 wherein the first potential comprises a power supply voltage.

11. The amplifier circuit of claim 3 wherein the second potential comprises ground potential.

12. The amplifier circuit of claim 3 wherein the first bias voltage comprises ground potential.

13. The amplifier circuit of claim 1 wherein the second stage amplifier comprises a unity gain inverting amplifier.

14. An amplifier circuit, comprising:

a first stage amplifier having an input terminal and an output terminal, the first stage amplifier being configured to operate with positive feedback;

an input capacitor connected between an amplifier input terminal and the input terminal of the first stage amplifier;

a second stage amplifier having an input terminal and an output terminal, the input terminal of the second stage amplifier being coupled to the output terminal of the first stage amplifier, the first stage amplifier and the second stage amplifier together forming an inverting amplifier between the output terminal of the second stage amplifier and the input terminal of the first stage amplifier; and a first feedback capacitor connected between the output terminal of the second stage amplifier and the input terminal of the first stage amplifier, the first feedback capacitor being operable to provide negative feedback from the output terminal of the second stage amplifier to the input terminal of the first stage amplifier.

15. The amplifier circuit of claim 14 wherein the first stage amplifier comprises:

an input transistor having a gate coupled to the input terminal of the first stage amplifier; and a positive feedback transistor coupled in parallel with the input transistor, the positive feedback transistor having a gate coupled to a node of the first stage amplifier that is non-inverting with respect to the input signal applied to the input terminal of the first stage amplifier.

16. The amplifier circuit of claim 14 wherein the first stage amplifier comprises:

a first and a second CMOS transistors coupled to form a first path for a current to flow from a first potential, the second CMOS transistor having a gate coupled to the input terminal of the first stage amplifier;

a third and a fourth CMOS transistors coupled to form a second path for a current to flow from the first potential, the fourth CMOS transistor having a gate coupled to a first bias voltage, the first and third CMOS transistors being coupled together at their respective gates; and a fifth CMOS transistor coupled to the second and fourth CMOS transistors and operable to receive the currents from the first and second paths and allow the currents to flow to the second potential.

17. The amplifier circuit of claim 16 wherein the fifth CMOS transistor is biased to allow a regulated current to flow through the fifth CMOS transistor.

18. The amplifier circuit of claim 16 wherein the first and the third CMOS transistors comprise PMOS-type transistors.

19. The amplifier circuit of claim 16 wherein the second, fourth and fifth CMOS transistors comprise NMOS-type transistors.

20. The amplifier circuit of claim 16 wherein the input capacitor is connected between the amplifier input terminal and a gate of the second transistor, and wherein a second feedback capacitor is connected between a drain of the fourth transistor and the gate of the second transistor.

21. The amplifier circuit of claim 16 wherein the first stage amplifier comprises a positive feedback transistor coupled in parallel with the second transistor, the positive feedback transistor having a gate coupled to the drain of the fourth transistor.

22. The amplifier circuit of claim 16 wherein the first and third CMOS transistors are configured to as a current mirror so that the magnitude of the current flowing through the first current path is equal to the current flowing through the second current path.

23. The amplifier circuit of claim 16 wherein the first potential comprises a power supply voltage.

24. The amplifier circuit of claim 16 wherein the second potential comprises ground potential.

25. The amplifier circuit of claim 16 wherein the first bias voltage comprises ground potential.

26. The amplifier circuit of claim 14 wherein the second stage amplifier comprises a unity gain inverting amplifier.

* * * * *